United States Patent
Owei et al.

(10) Patent No.: US 7,232,478 B2
(45) Date of Patent: Jun. 19, 2007

(54) ADHESION PROMOTION IN PRINTED CIRCUIT BOARDS

(75) Inventors: Abayomi I. Owei, Rancho Cucamonga, CA (US); Hiep X. Nguyen, West Covina, CA (US); Eric Yakobson, Aliso Viejo, CA (US)

(73) Assignee: Enthone Inc., West Haven, CT (US)

( * ) Notice: Subject to any disclaimer, the term of this patent is extended or adjusted under 35 U.S.C. 154(b) by 0 days.

(21) Appl. No.: 10/619,198

(22) Filed: Jul. 14, 2003

(65) Prior Publication Data

US 2005/0011400 A1    Jan. 20, 2005

(51) Int. Cl.
C23C 22/00 (2006.01)
C23C 22/05 (2006.01)
C23C 22/52 (2006.01)
C23C 22/63 (2006.01)
C23F 11/00 (2006.01)

(52) U.S. Cl. .............. 106/14.41; 106/14.44; 106/287.26; 148/243; 148/248; 148/282; 252/79.1; 252/79.2

(58) Field of Classification Search .............. 148/243, 148/282; 106/14.41, 14.44, 287.26; 156/316; 252/79.1, 79.2
See application file for complete search history.

(56) References Cited

U.S. PATENT DOCUMENTS

| | | | |
|---|---|---|---|
| 3,948,703 A | 4/1976 | Kushibe | |
| 4,051,057 A | 9/1977 | Ericson et al. | |
| 4,859,281 A * | 8/1989 | Goltz | 216/106 |
| 4,956,035 A | 9/1990 | Sedlak | |
| 5,106,454 A | 4/1992 | Allardyce et al. | |
| 5,261,154 A | 11/1993 | Ferrier et al. | |
| 5,289,630 A | 3/1994 | Ferrier et al. | |
| 5,435,860 A | 7/1995 | Maki et al. | |
| 5,439,783 A | 8/1995 | Akiyama et al. | |
| 5,468,515 A | 11/1995 | Ferrier et al. | |
| 5,476,947 A | 12/1995 | Maki et al. | |
| 5,496,590 A | 3/1996 | Maki et al. | |
| 5,518,760 A | 5/1996 | Ferrier et al. | |
| 5,532,094 A | 7/1996 | Arimura et al. | |
| 5,536,386 A | 7/1996 | Ferrier et al. | |
| 5,632,927 A | 5/1997 | Ferrier et al. | |
| 5,700,389 A | 12/1997 | Nakagawa | |
| 5,733,599 A | 3/1998 | Ferrier et al. | |
| 5,759,378 A | 6/1998 | Ferrier et al. | |
| 5,800,859 A | 9/1998 | Price et al. | |
| 5,807,493 A | 9/1998 | Maki et al. | |
| 5,869,130 A | 2/1999 | Ferrier | |
| 5,885,476 A | 3/1999 | Hong et al. | |
| 5,935,640 A | 8/1999 | Ferrier et al. | |
| 5,965,036 A | 10/1999 | Maki et al. | |
| 6,020,029 A | 2/2000 | Ferrier et al. | |
| 6,036,758 A * | 3/2000 | Fairweather | 106/14.44 |
| 6,054,061 A | 4/2000 | Bayes et al. | |
| 6,074,803 A | 6/2000 | McGrath et al. | |
| 6,146,701 A | 11/2000 | Ferrier | |
| 6,162,503 A | 12/2000 | Ferrier | |
| 6,261,466 B1 | 7/2001 | Bayes et al. | |
| 6,284,309 B1 | 9/2001 | Bishop et al. | |
| 6,294,220 B1 | 9/2001 | McGrath et al. | |
| 6,383,272 B1 | 5/2002 | Ferrier | |
| 6,419,784 B1 | 7/2002 | Ferrier | |
| 6,475,316 B1 | 11/2002 | Kirk et al. | |
| 6,503,566 B2 * | 1/2003 | Ferrier | 427/327 |
| 6,506,314 B1 * | 1/2003 | Whitney et al. | 216/100 |
| 6,521,139 B1 * | 2/2003 | Kondo et al. | 216/108 |
| 6,544,436 B2 | 4/2003 | Morikawa et al. | |
| 6,554,948 B1 * | 4/2003 | Ferrier | 156/326 |
| 6,562,149 B1 | 5/2003 | Grieser et al. | |
| 6,569,349 B1 * | 5/2003 | Wang et al. | 252/79.1 |
| 6,746,547 B2 * | 6/2004 | Cole et al. | 148/243 |
| 6,752,878 B2 * | 6/2004 | Montano et al. | 148/243 |
| 6,936,543 B2 * | 8/2005 | Schroeder et al. | 438/692 |
| 7,037,351 B2 * | 5/2006 | Li et al. | 51/298 |
| 7,052,625 B2 * | 5/2006 | Chamberlin et al. | 216/88 |
| 2002/0038790 A1 | 4/2002 | Kurii et al. | |

FOREIGN PATENT DOCUMENTS

| | | |
|---|---|---|
| CA | 1 250 406 A | 2/1989 |
| EP | 0 696 651 A1 | 2/1996 |
| GB | 2 203 387 A | 10/1988 |
| JP | 51-27819 A * | 3/1976 |
| JP | 60-149790 A * | 8/1985 |
| JP | 3-79778 A * | 4/1991 |

OTHER PUBLICATIONS

Translation of JP60-149790A (Jul. 1985).*
Declaration of Abayomi I. Owei and David Ormerod (5 pages), (Sep. 2003).
Abstract of Sanshin et al. JP 01-240683; Sep. 26, 1989.

* cited by examiner

Primary Examiner—Anthony J. Green
(74) Attorney, Agent, or Firm—Senniger Powers

(57) ABSTRACT

An adhesion promotion process and composition for enhancing adhesion between a copper conducting layer and a dielectric material during manufacture of a printed circuit board. The composition contains a corrosion inhibitor, an inorganic acid, and an alcohol which is effective to increase copper-loading in the composition.

5 Claims, No Drawings

ADHESION PROMOTION IN PRINTED CIRCUIT BOARDS

BACKGROUND OF THE INVENTION

This invention relates to improving adhesion of metal surfaces, such as copper to an insulating layer, in the manufacture of printed circuit boards.

A multilayer circuit board (MLB) has, among other things, a number of metal layers defining circuit patterns, and a number of insulating layers there-between. The metal layers defining circuit patterns today are typically formed from copper, and the insulating layers are typically formed from a resinous fiber-impregnated dielectric material. These respective layers can have a wide variety of thickness. For example, they can be on the order of only microns thick, or much thicker.

In manufacturing MLBs it is desirable to enhance the adhesion between the conducting and insulating layers to avoid delamination in subsequent manufacturing operations or in service. So called "black oxide" processes had been used for years which created a strongly adherent copper oxide layer to which an insulating layer would adhere better. Black oxide processes have, for most of the industry, been replaced by processes such as described in U.S. Pat. No. 5,800,859 involving formation of an organometallic conversion coating (OMCC). These OMCC processes involve exposing the copper circuit layer to an adhesion promotion solution, which contains various components including an oxidizer, an inhibitor, and a mineral acid.

One limitation on OMCC processes has been that after processing a number of boards through the same solution, sludge can form in the solution as copper builds up. The effective life of a solution is therefore limited by its tolerance for loading of copper. Another limitation is that the OMCC must be a uniform color, such as, for example, a dark brown or chocolate color. The industry associates this color with a uniform coating which has strong adhesion properties. A dark uniform color is preferred because it provides color contrast with copper to aid in inspection for defects. For example, it provides contrast for inspection for the so-called "pink-ring" defect. OMCC processes which produce significantly lighter coatings are generally unacceptable, or at least undesirable for most applications. For a lighter coating, "pink ring" defects are substantially more difficult to detect.

SUMMARY OF THE INVENTION

It is an aspect of this invention to provide an improved adhesion promotion method and composition, one characterized by enhanced capacity for copper loading, good peel strength, consistent and uniform OMCC color, resistance to thermal shock, and good adhesion between conducting and insulating layers.

Briefly, therefore, the invention is directed to an adhesion promotion composition for enhancing adhesion between a copper conducting layer and a dielectric material during manufacture of a printed circuit board, the adhesion promotion composition comprising a corrosion inhibitor, an inorganic acid, an oxidizing agent, and an alcohol which is effective to increase copper-loading in the composition. The adhesion promotion composition is initially substantially free of transition metals having a tendency to destabilize the oxidizing agent.

The invention is also directed to an adhesion promotion composition for enhancing adhesion between a copper conducting layer and a dielectric material during manufacture of a printed circuit board, the adhesion promotion composition comprising a corrosion inhibitor, an inorganic acid, an oxidizing agent, and an anionic surfactant. The adhesion promotion composition is initially substantially free of transition metals having a tendency to destabilize the oxidizing agent.

In another aspect the invention is an adhesion promotion composition for enhancing adhesion between a copper conducting layer and a dielectric material by formation of an organometallic conversion coating during manufacture of a printed circuit board. This adhesion promotion composition comprises a corrosion inhibitor, an inorganic acid, and a nonionic surfactant, and the adhesion promotion composition is initially substantially free of transition metals having a tendency to destabilize the oxidizing agent.

The invention is also an adhesion promotion composition comprising a corrosion inhibitor, an inorganic acid, and a nonylphenolic nonionic surfactant.

A further aspect of the invention is an adhesion promotion composition comprising a corrosion inhibitor, nitric acid, and an alcohol which is effective to increase copper-loading in the composition.

Another aspect of the invention is a process for enhancing adhesion between a copper conducting layer and a dielectric material during manufacture of a printed circuit board, the process comprising exposing the copper conducting layer to an adhesion promotion composition comprising a corrosion inhibitor, an inorganic acid, an oxidizing agent, and an alcohol which is effective to increase copper-loading in the composition, wherein the adhesion promotion composition is initially substantially free of transition metals having a tendency to destabilize the oxidizing agent, to thereby yield a microroughened copper surface.

Other aspects and features will be in part apparent and in part pointed out hereinafter.

DETAILED DESCRIPTION OF PREFERRED EMBODIMENTS

This invention includes an adhesion promotion composition, an adhesion promotion composition concentrate, and a method for enhancing adhesion. The method can involve any dip, spray, or other process employed in the industry for exposing a copper-conducting layer in a printed circuit board manufacturing operation to an adhesion promoter. As a general proposition, copper on the conducting layer is oxidized and some is solubilized. Cuprous copper generally dominates on the surface, and cupric copper generally dominates in solution. The cuprous copper on the surface binds with the corrosion inhibitor to form copper-inhibitor-complex as copper dissolves from the conducting copper layer into the adhesion promoter chemistry at the same time. This results in micro-roughened surface morphology of the conducting copper layer. This micro-roughened copper surface promotes adhesion with the subsequently applied insulating layer.

Hydrogen peroxide is incorporated into the adhesion promotion composition of the invention as an oxidizing agent to oxidize copper on the substrate. Hydrogen peroxide is present in the adhesion promotion composition at a concentration of at least about 1 wt %. The concentration of hydrogen peroxide is typically no greater than about 20%, and in certain preferred embodiments it is no greater than about 10%. One most preferred concentration of hydrogen peroxide is from about 0.5% by weight of the adhesion promotion composition to about 4% by weight. It has been found that when the concentration of hydrogen peroxide in the adhesion promotion composition is too high the structure of the roughened surface of the conducting layer forms a somewhat dendritic structure which is more fragile than the desired roughening effect, so that it forms a weaker bond than when lower concentrations of hydrogen peroxide are used. Moreover, the OMCC becomes hazy if there is overetching by too much hydrogen peroxide. All percentages herein are by weight unless indicated otherwise. Moreover, all concentrations are normalized such that they refer to concentrations of each element as if used in 100% concentrations. For example, in one embodiment the $H_2O_2$ solution added to the composition is 35% concentrated $H_2O_2$, rather than a 100% concentrated $H_2O_2$. However, the 20%, 10%, 4% etc. numbers provided above are % of 100% $H_2O_2$ in the final composition, not % of 35% $H_2O_2$ in the final composition.

To enhance the stability of the composition, the composition is preferably initially substantially free of transition metals such as copper which have a tendency to destabilize the oxidizing agent. For example, copper ions are avoided in the initial solution because they have a tendency to destabilize hydrogen peroxide. This requirement pertains to the initial composition in that the copper is avoided in the fresh composition before its use to promote adhesion. Upon use, however, copper is not excluded from the composition because, in fact, copper does tend to accumulate in the solution during use. The composition is "substantially" free of transition metals in that any trace amounts in the composition are sufficiently low as to not significantly contribute to degradation of the oxidizing agent; for example, sufficiently low as to not increase the degradation rate by more than about 10%.

The adhesion promotion composition comprises one or more inorganic acids for the main purpose of solubilizing copper, and maintaining other components of the composition in solution. A variety of acids, such as mineral acids including phosphoric acid, nitric acid, sulphuric acid, and mixtures thereof are workable. In one preferred embodiment both $HNO_3$ and $H_2SO_4$ are employed. It has been discovered that in addition to solubilizing the Cu, $H_2SO_4$ helps to moderate the etch rate, and therefore help prevent overetching of the substrate in isolated areas. The $HNO_3$ increases the etch rate; increases the solubility of Cu; helps prevent premature sludge formation; and works synergistically with $H_2O_2$, $H_2SO_4$, and the corrosion inhibitor to darken the coating. The overall acid concentration in the composition is generally at least 1%, preferably at least 8%, and in certain preferred embodiments at least 14% of the composition. The etch rate is slowed excessively if the acid concentration is too high, with the exception of nitric acid, and can yield an organometallic conversion coating which is non-uniform and too light in color. For this reason, the acidity level in previous compositions had been typically selected to be about 20%. However, in the present invention it is possible to push the acidity level up to about 25% and above, because with the other additives described herein, the coating is not lightened as would otherwise be expected with an acid level elevated to about 25%. The overall acid level is typically maintained below about 50%. In one preferred embodiment, therefore, there is between about 22% and about 28% acid, including about 20% $H_2SO_4$ (50% grade) and about 5% $HNO_3$(95% grade). In one preferred embodiment, the inorganic acid constitutes at least about 30% of the composition. Another preferred embodiment employs 28% $H_2SO_4$ (50% grade) and 5% $HNO_3$ (95% grade). $HNO_3$ is employed in these preferred embodiments because it has been discovered that it has a unique ability to solubilize the inhibitor-Cu complex better than do other mineral acids. While these percentages are percentages of the acids in the final composition and are based on use of 100% concentrated acid, as discussed above, the preferred forms of the acids actually added are 50% concentrated $H_2SO_4$ and about 95% concentrated $HNO_3$.

Inasmuch as certain of the preferred compositions employ $HNO_3$, the overall composition is formulated to be compatible therewith. In particular, thiourea-based complexing agents are specifically avoided due to the explosive nature thereof when mixed with $HNO_3$.

In general, triazoles, tetrazoles, imidazoles and mixtures thereof have been proposed as corrosion inhibitors in adhesion promotion compositions. Benzotriazole (BTA) compounds are most preferred due to their effectiveness in chelating Cu, their effectiveness to inhibit corrosion, and their effectiveness to help darken the OMCC surface. The most preferred BTA compound currently is 1,2,3-benzotriazole, also known as aziamino-benzene or benzene azimide, and has the formula $C_6H_4NHN_2$. Particularly desirable results are achieved with corrosion inhibitor concentrations of at least 0.1%, more preferably more than 0.5% by weight, and something more than 1% by weight. Generally, the corrosion inhibitor will be present in the composition in an amount no greater than 20%, preferably no greater than 10%, and more preferably less than 5% by weight of the total weight of the adhesion promotion composition. High concentrations, such as more than 5% can be desirable as they can allow a reduction in the processing time. In certain preferred embodiments, however, the concentration is less than 5% or even less than 1%.

The invention also employs various additives to the adhesion promoting composition, as discussed in more detail below, selected from among monomeric and oligomeric alcohols, and polymeric, oligomeric, and monomeric alcohol derivatives, including, but not limited to alcohol sulfates, sulfonates, and ethoxylates.

One embodiment of the invention employs a sulfonated anionic surfactant. It has been discovered that in addition to surface wetting, this surfactant helps to stabilize the $H_2O_2$. The most particularly preferred of such surfactants is dodecylbenzene sulfonic acid (DDBSA). DDBSA is available from Ashland Distribution Company of Santa Ana, Calif.; or from Pilot Chemical Company of Santa Fe Springs, Calif. under the trade designation Calsoft LAS 99. Other such surfactants include sodium dodecylbenzene sulfonate available from Witco Corporation, Organic Division, of New York, N.Y. under the trade designation Witconate 1850; isopropyl amine branched alkyl benzene sulfonate available from Stepan Company of Northfield, Ill. under the trade designation Polystep A-11; and TEA dodecylbenzene sulfonate available from Norman, Fox & Company of Vernon, Calif. under the trade designation Norfox T-60. This surfactant is used in a quantity sufficient to achieve surface wetting and $H_2O_2$ stabilization, which quantity can vary depending on the overall composition of the adhesion promoter. One currently preferred embodiment includes at least about 0.0001% of sulfonated anionic surfactant. As a general proposition, the sulfonated anionic surfactant concentration is at least about 0.005%, preferably at least about 0.1%; and is less than about 10%, preferably less than about 5%, more preferably less than about 2%. One specific example employs 0.002% of this surfactant, particularly DDBSA.

A currently preferred embodiment of the invention also incorporates a sulfated anionic surfactant. One preferred example of this compound is sodium 2-ethylhexyl sulfate, also known as 2-ethylhexanol sulfate sodium salt, having the formula $C_4H_9CH(C_2H_5)CH_2SO_4Na$. This is available from Niacet Corporation of Niagara Falls, N.Y. under the trade designation Niaproof 08, which contains 38.5 to 40.5% sodium 2-ethylhexyl sulfate and the balance water. Alternatives include sodium tetradecyl sulfate available from Niacet under the trade designation Niaproof 4, sodium lauryl sulfate available from Stepan Company of Northfield, Ill. under the trade designation Polystep B-5, and sodium n-decyl sulfate available from Henkel Corporation/Emery Group, Cospha/CD of Ambler, Pa. under the trade designation Sulfotex 110. The addition of a sulfated anionic surfactant compound surprisingly permits the acidity level to be raised, without the expected detrimental effect of lightening the coating. Because the acidity level can be raised in this manner, copper loading is increased. It also helps darken the coating. This compound is present in this embodiment in a concentration sufficient to increase copper loading without substantial lightening of the coating. The typical concentration is at least about 0.001%, and preferably at least about 0.1%. The concentration of sulfated anionic surfactant is no greater than about 10%, and preferably no greater than about 5%. One preferred range is between about 0.05 and 2%. In one preferred embodiment the sulfated anionic surfactant concentration is about 0.5%. In another it is 0.15%.

In a currently preferred embodiment, the composition also includes one or more ethoxylated phenol derivatives as a nonionic surfactant. This surfactant has been discovered to provide the unexpected additional benefit of improving peel strength. In one preferred embodiment this surfactant is one or more ethoxylated nonylphenols, such as polyoxyethylene nonylphenol. Polyoxyethylene nonylphenol is available from Dow Chemical Company of Midland, Mich. under the trade designation Tergitol NP9. Alternatives include an ethoxylated nonylphenol available from Dow Chemical Company of Midland, Mich. under the trade designation Tergitol NP8, nonylphenoxypolyethoxyethanol available from Union Carbide Corporation of Danbury, Conn. under the trade designation Triton N, and ethoxylated nonylphenol (or nonoxynol-2) available from Rhone-Poulenc, Surfactant & Specialty Division of New Jersey under the trade designation Igepal CO-210. The concentration of this surfactant is selected to be sufficient to improve peel strength. One currently preferred embodiment includes at least about 0.0001% of an ethoxylated phenol derivative. As a general proposition, the concentration is at least about 0.01%, preferably at least about 0.2%; and is less than about 10%, preferably less than about 5%. One preferred range is between about 0.0001% and about 2%. One exemplary embodiment contains 0.02%.

It has been discovered that incorporating monohydric, dihydric, trihydric, primary, secondary, and/or tertiary alcohols that solubilize the BTA copper complex can enhance copper loading of the adhesion promotion composition. Suitable aliphatic saturated alcohols are be 1,2-(ethylene glycol, propane-1,2-diol, butane-1,2-diol, etc.), 1,3-(propane-1,3-diol, butane-1,3-diol, etc.), 1,4-(butane-1,4-diol, hexane-1,4-diol, etc.), 1,5-, etc. Then there are unsaturated diols, such as butene diol, hexene diol, and acetylenics such as butyne diol. An example of a suitable trihydric alcohol is glycerol. Alcohols among suitable monohydric, dihydric, and/or trihydric alcohols, are triethylene glycol, ethylene glycol, diethylene glycol, diethylene glycol methyl ether, triethylene glycol monomethyl ether, triethylene glycol dimethyl ether, propylene glycol, dipropylene glycol, glycerol (trihydric), tetrahydrofurfuryl alcohol, gamma-butyrolactone, 1,4-butanediol, 2-butene-1,4-diol (unsaturated), 1,6-hexanediol, methanol, and isopropanol. This additive is present in this embodiment at a concentration sufficient to increase copper loading of the composition. Typically, this concentration is at least about 0.01%, and in certain embodiments is at least about 0.5%. The concentration of this additive is no greater than about 20%, and in certain embodiments no greater than about 10%.

One preferred alcohol example that has proven to be especially effective is the oligomer triethylene glycol (TEG). In particular, compositions containing this oligomer have copper-loading capacity of about 30 grams copper per liter solution up to about 35 and even about 40 g/L in dip process applications. In spray process and flooded immersion process applications, automated and conveyorized applications, these compositions have copper-loading capacity of up to about 45 g/L and even up to 50 g/L. This triethylene glycol is an oligomer in that it is a molecule of intermediate relative molecular mass with a structure comprising a small number of units derived from molecules of lower relative molecular mass. This is in contrast to a polymer, which has a high relative molecular mass. This triethylene glycol is also oligomeric in that its properties vary significantly with removal of one of its units; as opposed to polymeric compounds, with which removal of one or a few units has a relatively negligible effect on molecular properties. This triethylene glycol has the molecular formula $C_6H_{14}O_4$, more specifically, $HO(C_2H_4O)_3H$, and a molecular weight of 150.17. Triethylene glycol is present in this embodiment at a concentration of at least about 0.01%, typically at least about 0.5%, and in one embodiment at least about 0.8%. The concentration of TEG is no greater than about 20%, and preferably no greater than about 10%. In a currently preferred embodiment the TEG concentration is about 1%. The TEG also has the added benefit of helping to stabilize the $H_2O_2$.

The composition optionally also includes an additional stabilizing agent for the $H_2O_2$. Suitable stabilizing agents include, for example, dipicolinic acid, diglycolic and thiodiglycolic acid, ethylene diamine tetra-acetic acid and its derivatives, magnesium salt of an aminopolycarboxylic acid, sodium silicate, phosphates, phosphonates, and sulphonates. When the composition includes a stabilizing agent, preferably the stabilizing agent is present in an amount of from 0.001% or even at least 0.005% by weight of the adhesion promotion composition. Generally there is no more than 1% by weight in the composition. The currently preferred composition contains an additional stabilizing agent, but relies primarily on the stabilizing function of the TEG, as described above.

The composition further includes a source of halide ions. This source is preferably HCl, and provides a chloride ion concentration in the range of about 10 to 100 ppm. The most preferred range for one embodiment is between about 60 and 65 ppm. Preferred ranges are different for other embodiments depending on the overall composition and application. This increased $Cl^-$ level in comparison to previous formulations helps to increase the ratio of cuprous copper to cupric copper, which has been discovered to increase peel strength. The $Cl^-$ level tapers off and then stabilizes during use of the composition. As such, an initial $Cl^-$ ion concentration of between about 20 ppm and about 100 ppm is preferred in one embodiment in order to achieve a $Cl^-$ ion content in service of on the order of about 20 to 80 ppm.

The adhesion promotion composition is manufactured by mixing the components in an aqueous solution, preferably using deionized water. In accordance with standard safe practice, hydrogen peroxide is added to the composition in a diluted form.

The copper surface is contacted with the adhesion promotion composition generally without any pre-treatment. The copper surface may have previously been provided with a tarnish-inhibiting coating, e.g., by incorporating the tarnish inhibitor into a resist stripping composition used in an immediately preceding step of etch resist stripping. Tarnish inhibitors used in such strippers are, for example, a triazole or other coating. If so, it may be desirable to pre-clean the copper surface with an acidic pre-cleaner such as PC 7077 or PC 7086 or PC 7096 (trademarks for products of Enthone Inc. of West Haven, Conn.), before contact with the composition. Preferably prior to contact with the adhesion promotion composition, the copper surface will be substantially dry or have only minimal wetness. Apart from such a cleaning step, it is generally unnecessary to carry out any pretreating steps. In a preferred embodiment of the invention, the adhesion promotion step follows immediately after an etch resist stripping step or there is a single precleaning step between the etch resist stripping step and the adhesion promotion step.

Contact with the adhesion promotion composition may be by any conventional means, for example by immersion in a bath of the adhesion promotion composition or by spraying or any other means of contact. Contact may be as part of a continuous process. As is well understood in the art, immersion processes involve simply dipping the substrate into a bath of the composition for the desired period. Spray processes typically involve application using a series of automated squeegee-type mechanisms. The method of application is not critical to the invention. However, as discussed above, the tolerance for copper loading can be greater for spray processes than for dip processes because, for example, there is more bath stagnation with dip processes.

Contact of the copper surface with the adhesion promotion composition is typically at a temperature between about 20 degree C. and about 40 degree C., though temperatures reasonably outside this range are operable. The contact time is generally no less than 1 second, preferably no less than 5 seconds, and often at least 10 seconds, most preferably at least 30 seconds. The maximum contact time may be up to 10 minutes, although preferably the contact time is no greater than 5 minutes, most preferably no greater than 2 minutes. A contact time of about 1 minute or less than 1 minute is standard. If the contact time of the adhesion promotion composition with the copper surface is too long, there is a risk that the copper surface may be etched away due to dissolution and/or that a deposit other than the micro-porous crystalline deposit that forms the microroughened surface will be deposited onto the surface of the conducting material.

After contact of the copper surface with the adhesion promotion composition to form the microroughened surface, generally a pre-preg layer may be placed directly adjacent to the copper surface and the pre-preg layer adhered directly to the copper surface in the adhesion step, forming a multi-layer PCB. Generally in the adhesion step heat and pressure are applied to initiate the adhesion reaction. In the adhesion step, mechanical bonding is due to penetration of the polymeric material of the insulating layer into the microroughened surface provided in the adhesion promotion step. Although it may be desirable to follow the adhesion promotion step with a specially formulated rinse step, it is often adequate to rinse just with water.

A pre-preg insulating layer is applied directly to the microroughened surface, i.e., preferably without any intermediate metal deposition onto the microroughened surface or the like, although optionally with a post-treatment cupric oxide removal or reduction operation to further enhance the bond strength as disclosed in U.S. Pat. No. 6,294,220. Pressure is applied by placing the layers that are to form the multi-layer laminate of the PCB in a press. Where pressure is applied it is generally from 100 to 400 psi, preferably from 150 to 300 psi. The temperature of this adhesion step will generally be at least about 100 degree C., preferably between about 120 degree C. and about 200 degree C. The adhesion step is generally carried out for any period from 5 minutes to 3 hours, most usually from 20 minutes to 1 hour, but is for sufficient time and pressure and at a sufficiently high temperature to ensure good adhesion between the first and second layers. During this adhesion step, the polymeric material of the insulating layers, generally an epoxy resin, tends to flow ensuring that the conductive pattern in the metal is substantially sealed between insulating layers, so subsequent penetration of water and air is avoided. Several layers may be placed together in the adhesion step to effect lamination of several layers in a single step to form the MLB.

Though the exemplary arrangement discussed at length herein is a pre-preg layer adhered to a copper surface, the invention also includes improving adhesion of other dielectric materials, whether permanent or temporary, to copper. For example, the invention improves adhesion between copper and a solder mask that is dielectric. It similarly improves copper adhesion with inks, polymeric photo-resists, and dry films. It also has application in connection with photoimageable dielectrics or other dielectrics used in the context of high density interconnect and sequential build up technologies.

In one form the invention is a ready-to-use adhesion promotion composition that can be used directly for immersion or other exposure of the substrate. In another form the invention is a concentrate that is to be diluted to form the composition for immersion or other exposure.

An exemplary ready-to-use composition includes the following:

0.5 to 8 wt % $H_2O_2$
16 to 25 wt % $H_2SO_4$
0.1 to 10 wt % $HNO_3$
0.1 to 2 wt % 1,2,3-benzotriazole
0.01 to 5 wt % triethylene glycol
0.05 to 2 wt % 2-ethyloxosulfonate (Niaproof 08)
0.0001 to 2 wt % dodecylbenzene sulfonic acid (DDBSA)
0.0001 to 2 wt % polyoxyethylene nonylphenol (Tergitol NP9)
40 to 70 wt % deionized water When provided as a concentrate, the ranges described above for the preferred proportions of the ingredients are essentially doubled, because the product is diluted with, for example, 50% water upon formulation of the composition for use. In one embodiment, the concentrate has the following ingredients:

32-50 wt % $H_2SO_4$
0.2 to 20 wt % $HNO_3$
0.2 to 4 wt % 1,2,3-benzotriazole
0.02 to 10 wt % triethylene glycol
0.002 to 4 wt % 2-ethyloxosulfonate (Niaproof 08)
0.0002 to 4 wt % dodecylbenzene sulfonic acid (DDBSA)
0.0002 to 4 wt % polyoxyethylene nonylphenol (Tergitol NP9)

The $H_2O_2$ is added later and is not included in the concentrate formulation. This concentrate is then incorporated into an overall solution in which, for example, about 43 wt % is this concentrate, about 7 wt % is $H_2O_2$, and about 50 wt % is water.

EXAMPLE 1

Five sample adhesion promotion compositions A through E were prepared by mixing the components in the percentages in Table 1 to form aqueous compositions.

TABLE 1

| Raw Material | Example A | Example B | Example C | Example D | Example E |
|---|---|---|---|---|---|
| $H_2O_2$ | 7.2 | 7.2 | 7.2 | 7.2 | 7.2 |
| $H_2SO_4$ | 28.0 | 28.0 | 28.0 | 28.0 | 28.0 |
| $HNO_3$ | 5.0 | 5.0 | 5.0 | 5.0 | 5.0 |
| 1,2,3-Benzotriazole | 1.0 | 1.0 | 1.0 | 1.0 | 1.0 |
| Triethylene glycol | 0.00 | 0.00 | 0.00 | 0.00 | 0.9 |
| 2-ethyoxosulfonate (Niaproof 08) | 0.00 | 0.00 | 0.00 | 0.15 | 0.15 |
| Dodecylbenzene Sulfonic acid (DDBSA) | 0.00 | 0.002 | 0.002 | 0.002 | 0.002 |
| Polyoxyethylene Nonylphenol (Tergitol NP 9) | 0.00 | 0.00 | 0.002 | 0.002 | 0.002 |
| Water (Deionized) | 58.8 | 58.8 | 58.79 | 58.65 | 57.75 |
| Peel Strength (lb./inch) | 5.58 | N/A | 6.32 | N/A | 7.0 |
| Coating Appearance Rating* | 2 | 3 | 4 | 5 | 5 |
| Sludge (After 120 hrs @ 40–50 g/l of Cu++ loading (% by volume) | 10 | N/A | N/A | 6 | 0.001 |
| Organic Inhibitor % Drop | 3.4 | 2.29 | N/A | 1.6 | N/A |
| Chloride Stability (Drop in ppm) | 2.2 | 3.25 | N/A | 2.4 | N/A |
| Hydrogen Peroxide: vol. % Drop | 0.174 | 0.112 | N/A | 0.117 | N/A |

Note:
a) Wt % Based on 100% of Examples &
b) N/A = Test was either not conducted or not available.
Key to Coating Appearance Rating
5 = Uniform dark reddish brown
4 = Fairly uniform dark reddish brown
3 = Fairly uniform reddish brown
2 = Not uniform, light reddish brown Copper foil samples (Samples A through E) of the dimensions 5 in×5 in×1 mil (12.7 cm×12.7 cm×25 microns) were treated with the compositions A through E, respectively, by immersion for about 45 to 60 seconds to form an organometallic conversion coating. The substrates were then rinsed and dried.

EXAMPLE 2

Samples A, C, and E were bonded to a 370 FRA pre-preg material by pressing and baking. Lithographers' tape #616 available from 3M Company of St. Paul, Minn. was adhered to the copper side of the sample. The dimensions of each piece of tape were about ⅛ inch×5 inches (0.3 cm×12.7 cm). The tape was then pulled to separate the copper foil from the prepreg by use of a Peel Strength Tester (Model TA620-30) available from CECO of Garden Grove, Calif. The peel strengths of samples A, C, and E were 5.58, 6.32, and 7.0 lbs/inch, (991, 1131, and 1253 gms/cm), respectively. These results reveal that the adhesion promoter employing an oligomeric alcohol (triethylene glycol), the sulfated anionic surfactant (Niaproof 08), and the sulfonated anionic surfactant (DDBSA) provided the best adhesion.

EXAMPLE 3

The samples were visually inspected for coating appearance and ranked on a scale of 1 to 5 of increasing darkness and uniformity, with 5 corresponding to uniform dark reddish brown, 4 corresponding to fairly uniform dark reddish brown, 3 corresponding to fairly uniform reddish brown, and 2 corresponding to non-uniform light reddish brown. The coating appearances were graded as shown in Table 1, revealing that the best coating appearances were obtained with compositions D and E.

EXAMPLE 4

Compositions A, D, and E were tested for the formation of sludge by adding 40-50 g/L Cu++ and allowing them to stand at ambient conditions for 120 hours. The volume of sludge formed as a percentage of the overall volume of the solutions is presented in Table 1. These results reveal that the inclusion of the oligomeric alcohol (triethylene glycol) has a substantial positive impact on copper loading. In particular, less than about 0.1 volume % of Cu-containing sludge is formed at 120 hours under ambient conditions when the composition is loaded with between 40 and 50 g/liter Cu ions.

EXAMPLE 5

Samples A, B, and D, were tested for stability of organic inhibitor 1,2,3-benzotriazole (BTA). UV Vis Spectrophotometer analysis revealed the % drops in organic inhibitor after about 120 hours presented in Table 1. The more stable performance was achieved with composition D.

EXAMPLE 6

Samples A, B, and D, were tested for chloride stability. volumetric titration. The ppm drop in chloride ion concentration after 120 hours is presented in Table 1. The performances were comparable to each other, illustrating that the additives of the invention do not negatively affect chloride stability.

EXAMPLE 7

Samples A, B, and D, were tested for hydrogen peroxide stability by volumetric titration. The % drops in hydrogen peroxide concentration after 120 hours is presented in Table 1. The performances were comparable to each other, illustrating that the additives of the invention do not negatively affect hydrogen peroxide stability.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

The foregoing relates to a limited number of embodiments that have been provided for illustration purposes only. It is intended that the scope of invention is defined by the appended claims and there are modifications of the above embodiments that do not depart from the scope of the invention.

What is claimed is:

1. An adhesion promotion composition for enhancing adhesion between a copper conducting layer and a dielectric material during manufacture of a printed circuit board, the adhesion promotion composition comprising a corrosion inhibitor, an inorganic acid, an oxidizing agent, and an alcohol which is effective to increase copper-loading in the composition, and the adhesion promotion composition being initially substantially free of transition metals having a tendency to destabilize the oxidizing agent, wherein the inorganic acid is a mixture of sulfuric acid and nitric acid and constitutes at least about 30 wt % of the composition.

2. The adhesion promotion composition of claim 1 further comprising an anionic surfactant and a nonionic surfactant; wherein the inorganic acid is said mixture of sulfuric acid and nitric acid and constitutes at least about 30 wt % of the composition; and wherein the alcohol is selected from the group consisting of monohydric alcohols, dihydric alcohols, trihydric alcohols, primary alcohols, secondary alcohols, and tertiary alcohols and constitutes between about 0.5 wt % and about 20 wt % of the composition.

3. The adhesion promotion composition of claim 2 wherein the copper-loading of the composition is characterized by less than about 0.1 volume % of Cu-containing sludge being formed at 120 hours under ambient conditions when the composition is loaded with between 40 and 50 g/liter Cu ions.

4. An adhesion promotion composition for enhancing adhesion between a copper conducting layer and a dielectric material during manufacture of a printed circuit board, the adhesion promotion composition comprising a corrosion inhibitor, an inorganic acid, an oxidizing agent, and an alcohol which is effective to increase copper-loading in the composition, and the adhesion promotion composition being initially substantially free of transition metals having a tendency to destabilize the oxidizing agent, wherein the composition is substantially free of thiourea-based complexing agents, and the corrosion inhibitor is benzotriazole, the inorganic acid comprises sulfuric acid and nitric acid, the oxidizing agent is hydrogen peroxide, and the alcohol is triethylene glycol in the following proportions by weight percent:

0.5 to 8 wt % $H_2O_2$
16 to 25 wt % $H_2SO_4$
0.1 to 10 wt % $HNO_3$
0.1 to 2 wt % 1,2,3-benzotriazole
0.01 to 5 wt % triethylene glycol.

5. The adhesion promotion composition of claim 4 wherein the composition further comprises the following:

0.05 to 2 wt % 2-ethyloxosulfonate
0.0001 to 2 wt % dodecylbenzene sulfonic acid
0.0001 to 2 wt % polyoxyethylene nonyiphenol.

* * * * *